(12) United States Patent
Bhatta et al.

(10) Patent No.: US 10,484,027 B2
(45) Date of Patent: Nov. 19, 2019

(54) GLITCH FREE PHASE SELECTION MULTIPLEXER ENABLING FRACTIONAL FEEDBACK RATIOS IN PHASE LOCKED LOOPS

(71) Applicant: QUALCOMM Incorporated, San Diego, CA (US)

(72) Inventors: Debesh Bhatta, San Diego, CA (US); Deping Huang, San Diego, CA (US); Jeffrey Mark Hinrichs, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 98 days.

(21) Appl. No.: 15/419,981

(22) Filed: Jan. 30, 2017

(65) Prior Publication Data
US 2018/0138934 A1 May 17, 2018

Related U.S. Application Data

(60) Provisional application No. 62/421,845, filed on Nov. 14, 2016.

(51) Int. Cl.
*H04B 1/04* (2006.01)
*H03L 7/081* (2006.01)
*H03L 7/093* (2006.01)

(52) U.S. Cl.
CPC ........... *H04B 1/0483* (2013.01); *H03L 7/081* (2013.01)

(58) Field of Classification Search
CPC .................................................. H04B 1/0483
See application file for complete search history.

(56) References Cited

U.S. PATENT DOCUMENTS

| 6,329,850 | B1 * | 12/2001 | Mair ....................... G06F 1/025 327/105 |
| 7,365,580 | B2 | 4/2008 | Martin et al. |
| 7,777,534 | B2 * | 8/2010 | Kuan .................. H03K 5/1506 327/117 |
| 7,911,239 | B2 | 3/2011 | Saint-Laurent et al. |
| 7,911,240 | B1 * | 3/2011 | Lai ........................... G06F 1/10 327/298 |
| 2002/0135408 | A1 * | 9/2002 | Chiu ........................ G06F 1/08 327/145 |
| 2003/0118142 | A1 * | 6/2003 | Xiu ....................... H03L 7/0996 375/376 |

(Continued)

OTHER PUBLICATIONS

Jenlung Liu, et al.; "A 0.012mm 3.1 mW Bang-Bang Digital Fractional-N PLL with a Power-Supply-Noise Cancellation Technique and a Walking-One-Phase-Selection Fractional Frequency Divider"; ISSCC Feb. 2014, Session 15, Digital PLLs, 15.2; 2014 IEEE International Solid-State Circuits Conference, pp. 268-270.

(Continued)

*Primary Examiner* — Rasheed Gidado
(74) *Attorney, Agent, or Firm* — Loza & Loza, LLP (57) ABSTRACT

In some aspects, a method for phase multiplexing includes receiving a plurality of phases, selecting one of the plurality of phases based on a select signal using a multiplexer, and outputting the selected one of the plurality of phases at an output of the multiplexer. The method also includes gating the output of the multiplexer during a glitch at the output of the multiplexer.

30 Claims, 6 Drawing Sheets

(56) References Cited

U.S. PATENT DOCUMENTS

| | | | | |
|---|---|---|---|---|
| 2003/0234669 | A1* | 12/2003 | Foley | H03K 5/15013 327/107 |
| 2005/0131670 | A1* | 6/2005 | Wang | G06F 17/5027 703/23 |
| 2006/0145772 | A1* | 7/2006 | Xiu | H03L 7/0995 331/45 |
| 2007/0057697 | A1* | 3/2007 | Boerstler | G01R 31/31708 327/34 |
| 2007/0061657 | A1* | 3/2007 | Chang | G01R 31/31858 714/742 |
| 2007/0152719 | A1* | 7/2007 | Wu | G06F 1/08 327/99 |
| 2009/0296878 | A1* | 12/2009 | Tsai | H03K 23/667 377/47 |
| 2013/0132626 | A1* | 5/2013 | Furlan | G06F 13/36 710/110 |
| 2013/0249612 | A1* | 9/2013 | Zerbe | H04L 7/0079 327/161 |
| 2015/0222271 | A1* | 8/2015 | Singh | H03K 21/10 327/115 |
| 2016/0041578 | A1 | 2/2016 | Lee et al. | |
| 2016/0269034 | A1 | 9/2016 | Winemiller et al. | |

OTHER PUBLICATIONS

N. Krishnapura, et al.; "A 5.3 GHz Programmable Divider for HiPerLAN in 0.25μm CMOS"; Bell Laboratories, Lucent Technologies, Murray Hill, NJ, 07974, USA; ESSCIRC Sep. 1999, pp. 1-4.

Keliu Shu, et al.; "A 2.4-GHz Monolithic Fractional-N Frequency Synthesizer With Robust Phase=Switching Prescaler and Loop Capacitance Multiplier"; IEEE Journal of Solid-State Circuits, vol. 38, No. 6, Jun. 2003, pp. 866-874.

Liming Xiu, et al.; "A "Flying-Adder" Frequency Synthesis Architecture of Reducing VCO Stages," IEEE Transactions on Very Large Scale Integration (VLSI) Systems, vol. 13, No. 2, Feb. 2005, pp. 201-210.

* cited by examiner

GLITCH FREE PHASE SELECTION MULTIPLEXER ENABLING FRACTIONAL FEEDBACK RATIOS IN PHASE LOCKED LOOPS

RELATED APPLICATION

This application claims priority under 35 U.S.C. § 119(e) to U.S. Provisional Application No. 62/421,845 filed on Nov. 14, 2016, the entire specification of which is incorporated herein by reference.

BACKGROUND

Field

Aspects of the present disclosure relate generally to multiplexers, and more particularly, to phase selection multiplexers.

Background

A phase locked loop (PLL) may be used in frequency synthesis to generate a signal having a desired frequency. PLLs are widely used to provide signals having desired frequencies in wireless communication systems, micro-processing systems, and high-speed data systems. For example, PLLs may be used in a wireless communication system for frequency translation and channel selection.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a phase selection multiplexer. The phase selection multiplexer includes a multiplexer configured to receive a plurality of phases, to select one of the plurality of phases based on a select signal, and to output the selected one of the plurality of phases at an output of the multiplexer. The phase selection multiplexer also includes a flip-flop having a clock input coupled to the output of the multiplexer, a data input coupled to a gate signal, and an output, wherein the gate signal gates the output of the multiplexer during a glitch at the output of the multiplexer.

A second aspect relates to a method for phase multiplexing. The method includes receiving a plurality of phases, selecting one of the plurality of phases based on a select signal using a multiplexer, and outputting the selected one of the plurality of phases at an output of the multiplexer. The method also includes gating the output of the multiplexer during a glitch at the output of the multiplexer.

A third aspect relates to an apparatus for phase multiplexing. The apparatus includes means for receiving a plurality of phases, means for selecting one of the plurality of phases based on a select signal, means for outputting the selected one of the plurality of phases at an output, and means for gating the output during a glitch at the output.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
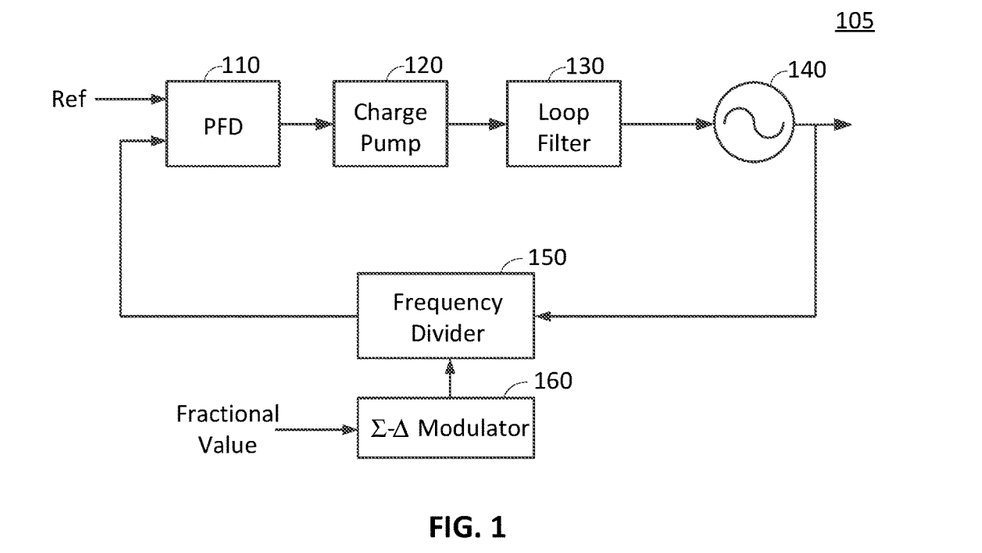
FIG. 1 shows an example of a fractional-N phase locked loop (PLL) according to certain aspects of the present disclosure.

FIG. 1 shows an example of a phase locked loop (PLL) 105. The PLL 105 includes a phase-frequency detector (PFD) 110, a charge pump 120, a loop filter 130, a voltage-controlled oscillator (VCO) 140, and a frequency divider 150. The output of the VCO 140 provides the output signal for the PLL 105, in which the frequency of the output signal is controlled by adjusting an input control voltage of the VCO 140, as discussed further below. The output signal is fed back to the PFD detector 110 through the frequency divider 150, which divides the frequency of the output signal by a divider value to produce a feedback signal.

The PFD detector 110 receives as inputs the feedback signal and a reference signal (denoted "Ref"). The reference signal Ref may come from a crystal oscillator or another source with a stable frequency. The PFD detector 110 detects the phase difference between the reference signal Ref and the feedback signal, and outputs the detected phase difference (error) to the charge pump 120. The charge pump 120 and the loop filter 130 convert the detected phase difference into a control voltage that controls the frequency of the VCO 140. The control voltage adjusts the frequency of the VCO 140 in a direction that reduces the phase difference between the reference signal Ref and the feedback signal. When the PLL 105 is locked, the output signal has a frequency approximately equal to the frequency of the reference signal Ref multiplied by the divider value of the frequency divider 150.

In a communication system, it may be desirable to change the output frequency of the PLL 105 (e.g., for channel selection). The output frequency may be changed by adjusting the divider value of the frequency divider 150. In one example, the frequency divider 150 may be an integer frequency divider, in which the divider value can be adjusted to any one of a plurality of different integer values. However, in order to adjust the output frequency of the PLL 105 with fine granularity (high resolution), the frequency divider 150 may need to adjust the divider value to a value with a fractional component. This can be achieved by switching the divider value of the frequency divider 150 between integer values such that the time-average value of the divider value has a fractional component approximately equal to a desired fractional value.

In this regard, the divider value of the frequency divider 150 may be controlled by a delta-sigma modulator 160, an example of which is shown in FIG. 1. In operation, the delta-sigma modulator 160 receives a desired fractional value for the divider value, and dynamically switches the divider value of the frequency divider 150 between integer values such that the time-average value of the divider value has a fractional component approximately equal to the desired fractional value. In other words, the delta-sigma modulator 160 dithers the divider value of the frequency divider in integer steps to achieve the desired fractional value. In this example, the PLL 105 may be referred to as a fractional-N PLL or another terminology. A drawback of the fractional-N PLL shown in FIG. 1 is that it tends to have worse phase noise than an integer PLL caused by dithering of the feedback divider value.

Figure 2:
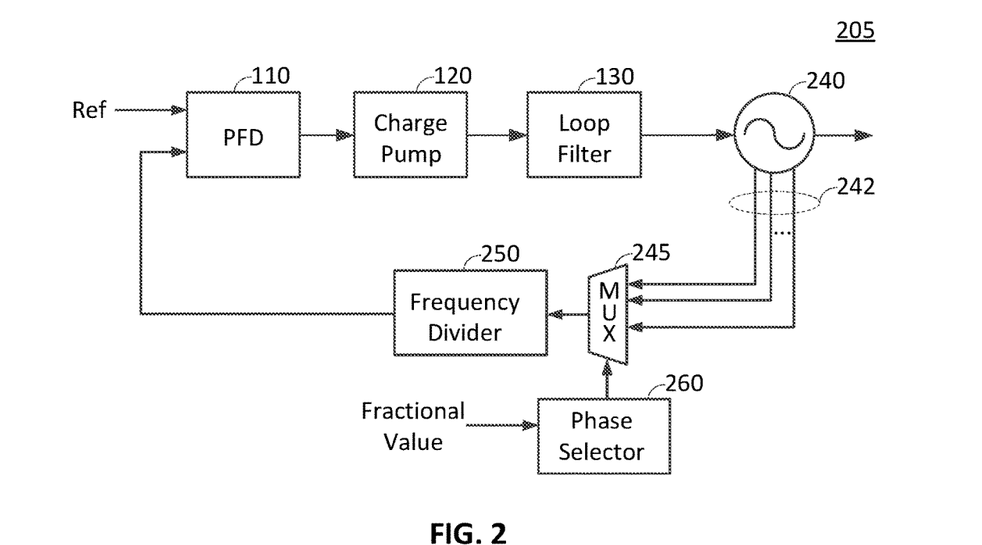
FIG. 2 shows an example of a PLL including a phase selection multiplexer according to certain aspects of the present disclosure.

If multiple phases of the VCO output are available, then the feedback divider value may be dithered in sub-integer steps by jumping between different phases of the VCO output, which reduces quantization noise. In this regard, FIG. 2 shows an example of a PLL 205 in which the VCO 240 outputs multiple phases 242 where the multiple phases 242 include multiple output signals of the VCO 240 having approximately the same frequency, but different phases. In one aspect, the phases 242 may be evenly spaced apart in phase. For example, if there are 16 phases 242, then the phases 242 may be separated in phase by approximately T/16, where T is one clock cycle of the VCO 240.

In the example shown in FIG. 2, the PLL 205 includes a phase selection multiplexer 245 and a frequency divider 250 (e.g., an integer frequency divider) in the feedback path of the PLL 205. The PLL 205 also includes a phase selector 260 for controlling the phase selected by the phase selection multiplexer 245. In operation, the phase selection multiplexer 245 selects one of the phases of the VCO output at a time under the control of the phase selector 260, and outputs the selected phase to the frequency divider 250. The phase selector 260 dynamically changes the phase selected by the phase selection multiplexer 245 such that the time-average value of the divider value has a fractional component approximately equal to the desired fractional value.

For a multi-phase VCO, a glitch-free multiplexer is needed to jump between the available phases without producing "runt" pulses. Prior designs can only jump between a limited number of adjacent phases at a time. There is a need for a glitch-free phase selection multiplexer supporting arbitrary steps.

Figure 3:
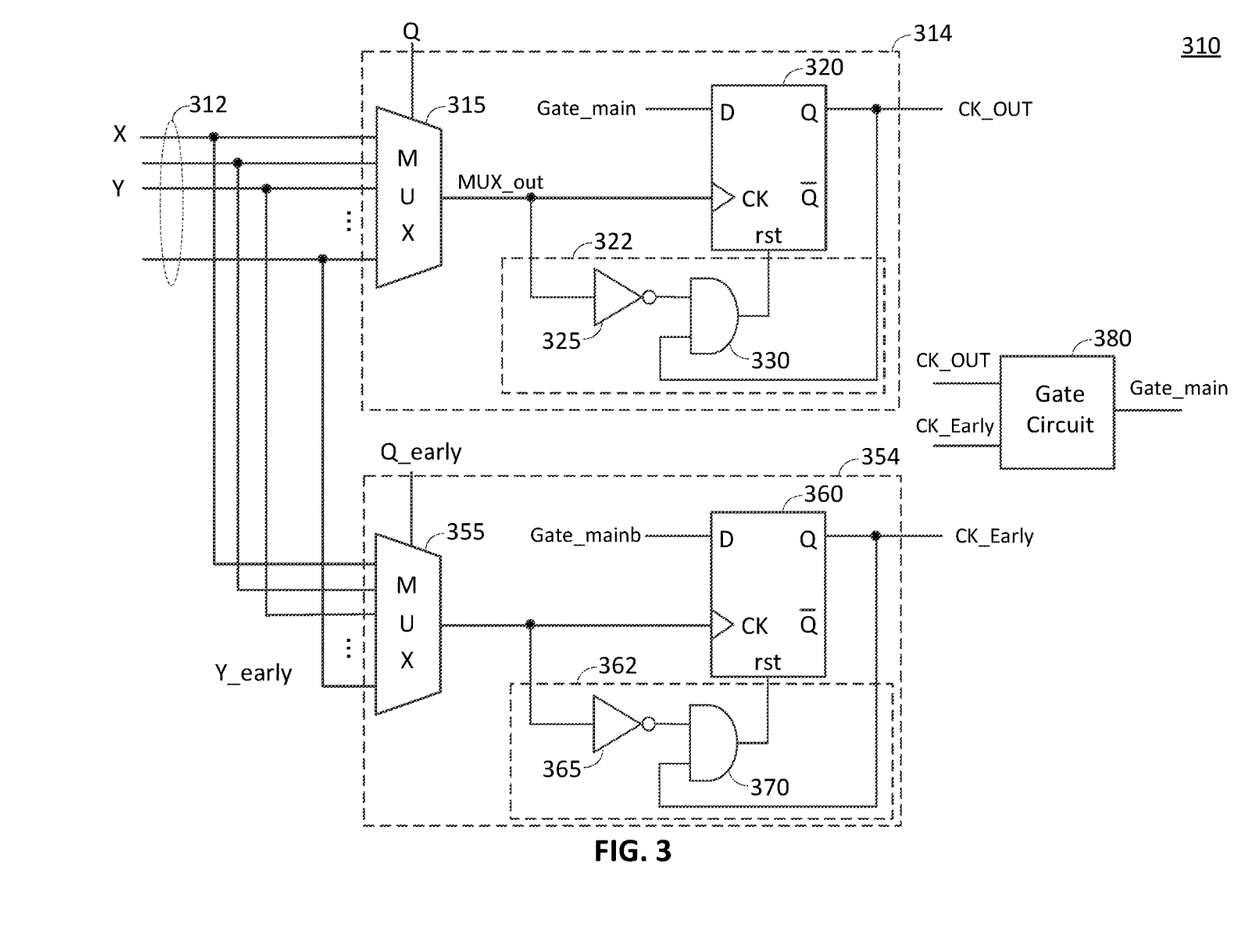
FIG. 3 shows an example of a phase selection multiplexer according to certain aspects of the present disclosure.

FIG. 3 shows an example of a glitch-free phase selection multiplexer 310 according to certain aspects of the present disclosure. The phase selection multiplexer 310 receives multiple phases 312 of a VCO output, selects one of the phases, and outputs the selected phase as output signal CK_OUT. For example, the phase selection multiplexer 310 may be used to implement the phase selection multiplexer 245 in FIG. 2. In this example, the multiple phases 312 correspond to the multiple phases 242 of VCO 240, and the output signal CK_OUT is output to frequency divider 250.

As discussed further below, the phase selection multiplexer 310 uses digital logic to properly time phase jumps to eliminate glitches. The phase selection multiplexer 310 also allows phase jumps between non-adjacent phases in a single step. For example, the phase selection multiplexer 310 may allow an arbitrary phase jump in a single step. This eliminates the constraint of minimum divider ratio, enabling high performance fractional-N PLL operation.

In the example in FIG. 3, the phase selection multiplexer 310 includes a first multiplexer (MUX) path 314, and a second MUX path 354. As discussed further below, the first MUX path 314 provides the output signal CK_OUT for the phase selection multiplexer 310. The second MUX path 354 provides an early output signal CK_Early used for generating a gate signal for masking out (suppressing) glitches, as discussed further below.

The first MUX path 314 includes a first multiplexer (MUX) 315, a first flip-flop 320, and a first reset circuit 322. The first MUX 315 is configured to receive the multiple phases 312 of the VCO output, select one of the phases according to a first select signal Q, and output the selected phase as output signal MUX_out. For the example in which the phase selection multiplexer 310 is used to implement the phase selection multiplexer 245, the first select signal Q may correspond to the phase selection of the phase selector 260.

The first flip-flop 320 has a clock input CK coupled to the output of the first MUX 315, an input D coupled to a gate signal Gate_main, and an output Q that outputs the output signal CK_OUT of the phase selection multiplexer 310. The first flip-flop 320 is positive edge triggered (i.e., latches the logic value of Gate_main on a rising edge of MUX_out). As discussed further below, the gate signal Gate_main is used to mask out (suppress) glitches in the output signal MUX_out of the first MUX 315 so that the glitches are not passed to the output of the phase selection multiplexer 310. The first flip-flop 320 may include a D flip-flop or another type of flip-flop.

In the example in FIG. 3, the first reset circuit 322 includes a first AND gate 330 and a first inverter 325. The first AND gate 330 has a first input coupled to the output of the first MUX 315 via the first inverter 325, a second input coupled to the output of the first flip-flop 320, and an output coupled to the reset input rst of the first flip-flop 320, as shown in FIG. 3. The first reset circuit 322 is configured to reset the first flip-flop 320 when the output of the first flip-flop 320 is logic one (high) and the output signal MUX_out transitions from one to zero (high to low).

In operation, when Gate_main is logic one (high), the first flip-flop 320 latches the logic one of Gate_main on a rising edge of the output signal MUX_out of the first MUX 315, and outputs the logic one at the output Q of the first flip-flop 320. Thus, when MUX_out becomes one (high), the output Q of the first flip-flop 320 becomes one (high). The first flip-flop 320 is reset when the output signal MUX_out transitions from one to zero (i.e., on the falling edge of MUX_out) by the first reset circuit 322. The reset causes the output Q of the first flip-flop 320 to transition from one to zero. Thus, when MUX_out becomes zero (low), the output Q of the first flip-flop 320 becomes zero (low). Therefore, when the gate signal Gate_main is one (high), the output Q of the first flip-flop 320 tracks MUX_out, and therefore effectively passes the output signal MUX_out of the first MUX 315 to the output of the phase selection multiplexer 310. As discussed further below, Gate_main is logic zero (low) during a glitch in MUX_out to mask out (suppress) the glitch.

The second MUX path 354 includes a second MUX 355, a second flip-flop 360, and a second reset circuit 362. The second MUX 355 is configured to receive the multiple phases 312 of the VCO output, select one of the phases according to a second select signal Q_early, and output the selected phase to the second flip-flop 360. In some aspects, the second select signal Q_early causes the second MUX 355 to select a phase that is early relative to the phase selected by the first MUX 315. Exemplary logic for generating the second select signal Q_early is provided below with reference to FIG. 7.

The second flip-flop 360 has a clock input CK coupled to the output of the second MUX 335, an input D coupled to gate signal Gate_mainb (e.g., logical inverse of Gate_main), and an output Q that outputs the early output signal CK_Early. As discussed further, CK_Early is used to generate Gate_main. The second flip-flop 360 is positive edge triggered (i.e., latches the logic value of Gate_mainb on a rising edge of the output of the second MUX 355). The second flip-flop 360 may include a D flip-flop or another type of flip-flop.

The second reset circuit 362 includes a second AND gate 370 and a second inverter 365. The second AND gate 370 has a first input coupled to the output of the second MUX 355 via the second inverter 365, a second input coupled to the output of the second flip-flop 360, and an output coupled to the reset input rst of the second flip-flop 360, as shown in FIG. 3. The second reset circuit 362 is configured to reset the second flip-flop 360 when the output of the second flip-flop 360 is logic one (high) and the output signal of the second MUX 355 transitions from one to zero (high to low).

In operation, the second flip-flop 360 passes the output of the second MUX 355 as output signal CK_Early when Gate_mainb is high (logic one), which may happen when the gate signal Gate_main is low (logic zero). The output signal CK_Early of the second flip-flop 360 may be early relative to the output signal CK_OUT of the first flip-flop 320 since the second MUX 355 selects an earlier phase than the first MUX 315. The second reset circuit 362 causes the second flip-flop 360 to reset when CK_Early is logic one (high) and the output of the second MUX 355 transitions from one to zero (i.e., on a falling edge of the output of the second MUX 355).

The phase selection multiplexer 310 also includes a gate circuit 380 that receives the output signals CK_Early and CK_OUT, and generates the gate signal Gate_main based on the output signals CK_Early and CK_OUT. In certain aspects, the gate circuit 380 is configured to transition the gate signal Gate_main from one to zero on a falling edge of CK_OUT and transition the gate signal Gate_main from zero to one on a rising edge of CK_Early. Thus, the gate signal Gate_main falls on a falling edge of CK_OUT and rises on a rising edge of CK_Early. As discussed further below, this causes the gate signal Gate_main to be zero (logically low) during a glitch in the output signal MUX_out of the first MUX 315, and to therefore mask out (suppress) the glitch.

Exemplary operations of the phase selection multiplexer 310 during a phase jump (switch) will now be described with reference to the timing diagram shown in FIG. 4 according to certain aspects of the present disclosure.

In this example, the phase selection multiplexer 310 jumps (switches) from phase X to phase Y. More particularly, the first select signal Q changes the selection of the first MUX 315 from phase X to phase Y at time t2, as shown in FIG. 4. The first MUX 315 switches from phase X to phase Y on a falling edge of phase X. This creates a glitch (e.g., a "runt" pulse) 410 at the output MUX_out of the first MUX 315. This is because phase Y is high during the phase jump (switch).

The gate signal Gate_main to the first flip-flop 320 is zero during the glitch 410. This is because the gate signal Gate_main falls on the falling edge of CK_OUT, and the glitch 410 occurs after the falling edge of CK_OUT. As a result, the gate signal Gate_main masks out (suppresses) the glitch 410, and therefore prevents the glitch 410 from being passed to the output CK_OUT of the phase selection multiplexer 310.

After the glitch 410, the gate signal Gate_main rises on the rising edge of CK_Early. This occurs before the arrival of the next rising edge 415 of the output signal MUX_out of the first MUX 315, which corresponds to the new phase Y. As a result, the gate signal Gate_main is logic one (high) during the first full pulse of the output signal MUX_out corresponding to the new phase Y, and therefore passes the first full pulse corresponding to the new phase Y to the output of the phase selection multiplexer 310. Thus, the gate signal Gate_main masks out (suppresses) the glitch 410 while allowing the first full pulse corresponding to the new phase Y to pass.

Figure 5:
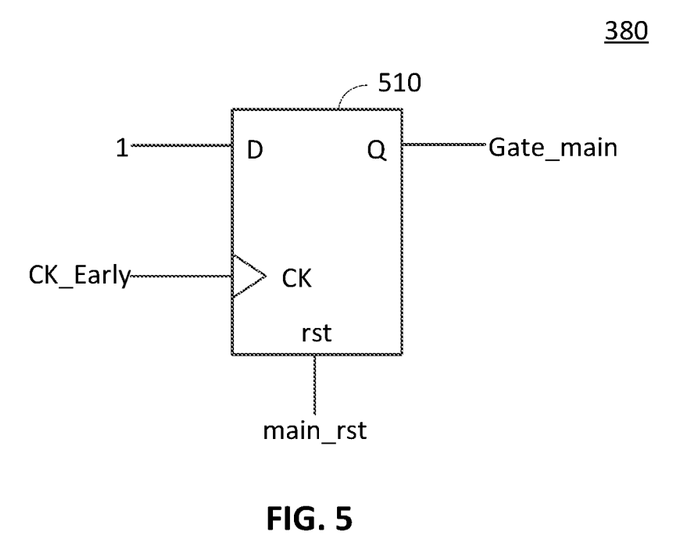
FIG. 5 shows an exemplary implementation of a gate circuit for generating a gate signal according to certain aspects of the present disclosure.

FIG. 5 shows an exemplary implementation of the gate circuit 380 for generating the gate signal Gate_main according to certain aspects of the present disclosure. In this example, the gate circuit 380 includes a gate flip-flop 510. The gate flip-flop 510 has a clock input CK coupled to CK_Early, an input D held at logic one, an output Q that outputs the gate signal Gate_main, and a reset input rst coupled to a reset signal main_rst. The reset signal main_rst may include a narrow pulse at each falling edge of CK_OUT, in which each narrow pulse causes the gate flip-flop 510 to reset. The gate flip-flop 510 is positive edge triggered (i.e., latches the logic value of one at the input D on a rising edge of CK_Early).

In operation, the output of the gate flip-flop 510 falls (transitions from one to zero) on a falling edge of CK_OUT. This is because the reset signal main_rst is asserted on the falling edge of CK_OUT, and therefore resets the gate flip-flop 510 on the falling edge of CK_OUT. Thus, the gate signal Gate_main output by the gate flip-flop 510 falls on the falling edge of CK_OUT. The output of the gate flip-flop 510 rises (transitions from zero to one) on a rising edge of CK_Early. This is because the gate flip-flop 510 latches the logic value of one at the input D of the gate flip-flop 510 on the rising edge of CK_Early. Thus, in this example, the gate signal Gate_main falls on a falling edge of CK_OUT and rises on a rising edge of CK_Early. When the gate signal Gate_main is logically low, the gate signal Gate_main gates output signal MUX_out and therefore masks out (suppresses) a glitch in output signal MUX_out. When the gate signal Gate_main is logically high, output signal MUX_out is passed to the output of the phase selection multiplexer 310, as discussed above.

The gate signal Gate_mainb may be generated by inverting gate signal Gate_main with an inverter (not shown).

Figure 6:
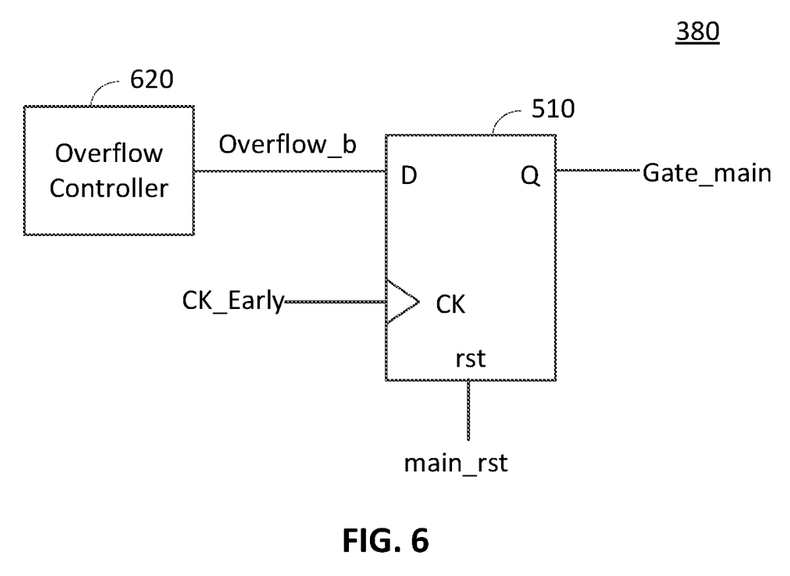
FIG. 6 shows another exemplary implementation of a gate circuit for generating a gate signal according to certain aspects of the present disclosure.

FIG. 6 shows another exemplary implementation of the gate circuit 380 for generating the gate signal Gate_main according to certain aspects of the present disclosure. In this example, the gate circuit 380 includes the gate flip-flop 510. The gate circuit 380 also includes an overflow controller 620 configured to detect whether a phase jump exceeds one clock cycle of the VCO, and output an overflow signal overflow_b to the input D of the gate flip-flop 510 based on whether the phase jump exceeds one clock cycle of the VCO. If the overflow controller 620 does not detect a phase jump exceeding one clock cycle, then the overflow controller 620 sets the overflow signal overflow_b high (logic one). In this case, the gate flip-flop 510 functions the same as discussed above with reference to FIG. 5. Thus, for phase jumps not exceeding one clock cycle, the gate flip-flop 510 functions the same as discussed above with reference to FIG. 5.

If the overflow controller 620 detects a phase jump exceeding one clock cycle, then the overflow controller 620 may set the overflow signal overflow_b low (logic zero) for at least one clock cycle of the VCO. This causes the gate signal Gate_main to be low (logic zero) for at least one clock cycle because the gate signal Gate_main is prevented from rising on a rising edge of CK_Early while the overflow signal overflow_b is low. As a result, the gate signal Gate_main masks out the output MUX_output of the first MUX 315 for at least one clock cycle, and therefore causes the output of the phase selection multiplexer 310 to skip at least one clock cycle. This allows a phase jump of more than one clock cycle at the output of the phase selection multiplexer 310. For example, for a phase jump of 17/16 T, the overflow controller 620 sets overflow_b low for one clock cycle so that the phase selection multiplexer 310 skips one clock cycle to achieve the one T (i.e., one clock cycle) portion of the phase jump. The remaining 1/16 T of the phase jump is achieved by changing the phase selection of the first MUX 315.

Figure 7:
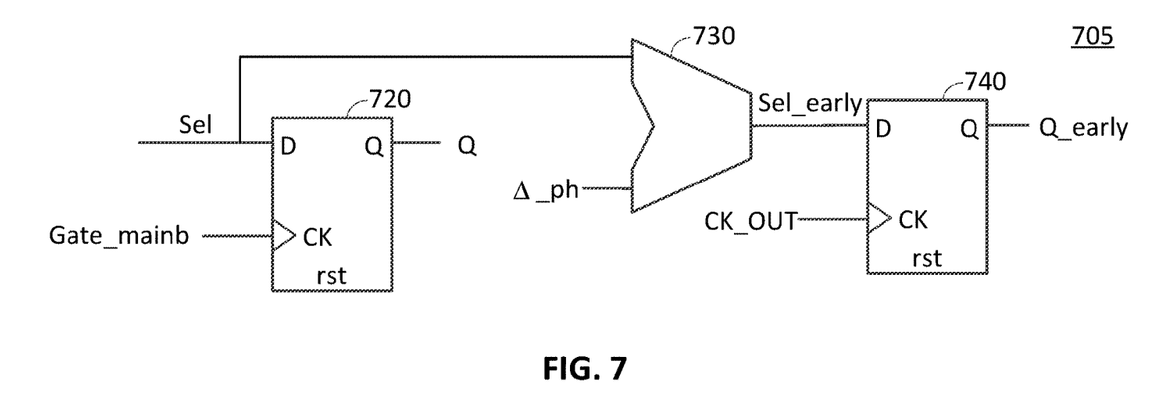
FIG. 7 shows an exemplary implementation of a select controller according to certain aspects of the present disclosure.

FIG. 7 shows an example of a select controller 705 for generating the first select signal Q and the second select signal Q_early discussed above. The select controller 705 includes a first flip-flop 720, a phase shifter 730, and a second flip-flop 740. Each of the first flip-flop 720 and the second flip-flop 740 may include a D-flip-flop or another type of flip-flop.

The first flip-flop 720 has a clock input CK coupled to gate signal Gate_mainb, an input D coupled to phase select signal Sel, and an output Q that outputs the first select signal Q to the first MUX 315 shown in FIG. 3. The phase select signal Sel may come from the phase selector 260 shown in FIG. 2. The first flip-flop 720 is positive edge triggered (i.e., latches the value of phase select signal Sel on a rising edge of gate signal Gate_mainb). Thus, when the phase select signal Sel changes, the first flip-flop 720 latches the phase change on a rising edge of gate signal Gate_mainb. As a result, the first select signal Q changes phases on the rising edge of gate signal Gate_mainb. This in turn causes the first MUX 315 to change phases on the rising edge of gate signal Gate_mainb. The rising edge of gate signal Gate_mainb coincides with a falling edge of CK_OUT. Thus, when the phase select signal Sel changes, the first MUX 315 performs the corresponding phase change (phase jump) on the falling edge of CK_OUT. An example of this is shown in FIG. 4, in which a phase change in the first select signal Q occurs on a falling edge of CK_OUT at time t2.

The first flip-flop 720 may be a multi-bit flip-flop capable of latching a multi-bit value of phase select signal Sel. For example, the phase select signal Sel may have a four-bit value indicating one of 16 available phases of the VCO. In this example, the first flip-flop 720 may be a four-bit flip-flop capable of latching the four-bit phase select signal Sel.

The phase shifter 730 receives the phase select signal Sel, and shifts the phase of phase select signal Sel by a phase Δ_ph to generate phase-shifted phase select signal Sel_early. In one example, phase select signal Sel_early is given by:

$$Sel\_early = Sel - \Delta\_ph \quad \text{(Eq. 1)}.$$

For example, if phase Δ_ph is equal to four phase units, then the phase of phase select signal Sel_early is early relative to the phase of phase select signal Sel by four phase units. In this example, one phase unit is equal to the phase difference between two adjacent phases from the VCO. Thus, if the multiple phases 312 from the VCO are separated by a phase of T/16, then four phase units is approximately equal to T/4, where T is one clock cycle of the VCO.

The second flip-flop 740 has a clock input CK coupled to output signal CK_OUT, an input D coupled to phase select signal Sel_early from the phase shifter 730, and an output Q that outputs the second select signal Q to the second MUX 355 shown in FIG. 3. The second flip-flop 740 is positive edge triggered (i.e., latches the phase select signal Sel_early on a rising edge of CK_OUT). Thus, when the phase select signal Sel_early changes, the second flip-flop 740 latches the phase change on a rising edge of CK_OUT. As a result, the second select signal Q_early changes phases on the rising edge of CK_OUT. This causes the second MUX 355 to change phases on the rising edge of CK_OUT. An example of this is shown in FIG. 4, in which a phase change in the second select signal Q_early occurs on a rising edge of CK_OUT at time t3.

In the above example, the phase of the second select signal Q_early is related to the phase of the first select signal Q by:

$$Q\_early = Q - \Delta\_ph \quad \text{(Eq. 2)}.$$

Thus, the phase of the second select signal Q_early is early relative to the phase of the first select signal Q by a phase of Δ_ph. Also, in the above example, when the first select signal Q changes phases, the second select signal Q_early changes phases when the phase change of the first select signal Q propagates to the output signal CK_OUT. An example of this is shown in FIG. 4. In this example, when the first select signal Q changes from phase X to phase Y, the second select signal Q_early changes phases when phase Y appears at CK_OUT at time t3.

As discussed above, the gate signal Gate_main is low (logic zero) during a glitch caused by a phase jump in order to mask out (suppress) the glitch. After the glitch, the gate signal Gate_main rises before the arrival of the first full pulse of the new phase in order to pass the first full pulse of the new phase to the output of the phase selection multiplexer 310. The timing of the rising edge of Gate_main is controlled by Q_early since Gate_main rises on a rising edge of CK_early. Therefore, the phase Δ_ph used to generate Q_early may be chosen such that the rising edge of Gate_main occurs after the glitch and before the arrival of the first full pulse of the new phase. In the example given above in which 16 phases of the VCO output are available, the phase Δ_ph is equal to four phase units. However, it is to be appreciated that the present disclosure is not limited to this example, and that the phase Δ_ph may vary, for example, depending on the phase Δ_ph needed to meet the timing requirements for the rising edge of Gate_main discussed above (e.g., rising edge of Gate_main occurs after the glitch and before the arrival of the first full pulse of the new phase) for a particular phase jump.

In the example discussed above, the phase of the second select signal Q_early is related to the phase of the first select signal Q by equation (2) (i.e., Q_early=Q−Δ_ph). In certain aspects, depending on the size of a phase jump, the second select signal Q_early may be changed to:

$$Q\_early = Q + \Delta\_ph \quad (Eq. 3)$$

prior to the phase jump. For example, if the phase jump is less than half a clock cycle of the VCO, then Q_early may be kept at Q−Δ_ph prior to the phase jump. If the phase jump is equal to or greater than half a clock cycle of the VCO, then Q_early may be changed to Q+Δ_ph prior to the phase jump. For instance, Q_early may be changed to Q+Δ_ph on the rising edge of CK_OUT prior to the phase jump. The reason for the change prior to the phase jump is that Q_early=Q+Δ_ph may provide better timing margins for Gate_main to meet the timing requirements discussed above when the phase jump is large (e.g., phase jump is equal to or greater than half a clock cycle).

Figure 4:
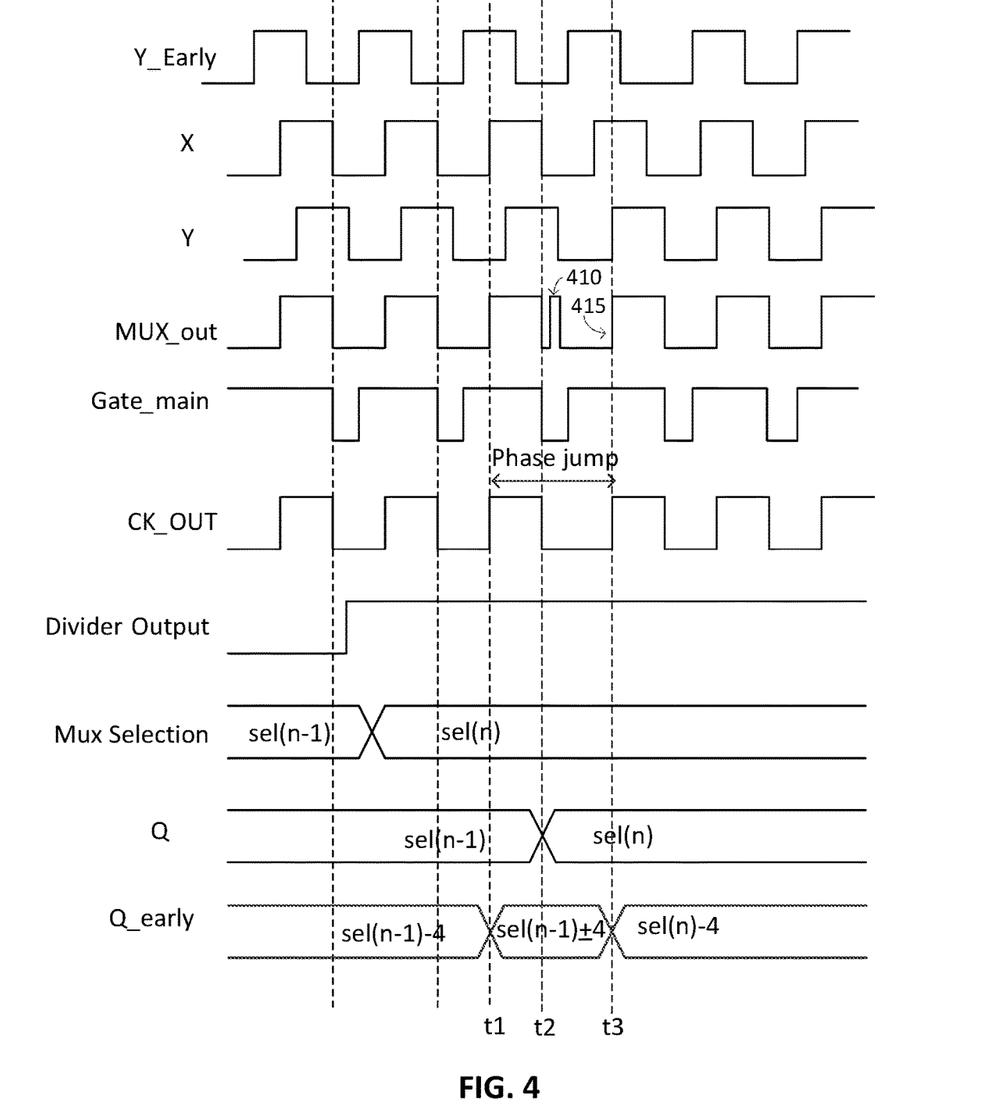
FIG. 4 is a timing diagram illustrating exemplary operations of the phase selection multiplexer according to certain aspects of the present disclosure.

FIG. 4 shows an example in which Q_early is kept at Q−Δ_ph or changed to Q+Δ_ph at time t1 depending on the size of the phase jump. In this example, t1 occurs at the rising edge of CK_OUT prior to the phase jump and Δ_ph is equal to four phase units. In this example, the phase shifter 730 may keep Q_early at Q−Δ_ph at time t1 if the phase jump is less than half a clock cycle. The phase shifter 730 may change Q_early to Q+Δ_ph at time t1 if the phase jump is equal to or greater than half a clock cycle. In this case, Q_early is changed to Q+Δ_ph in anticipation of the phase jump.

Figure 8:
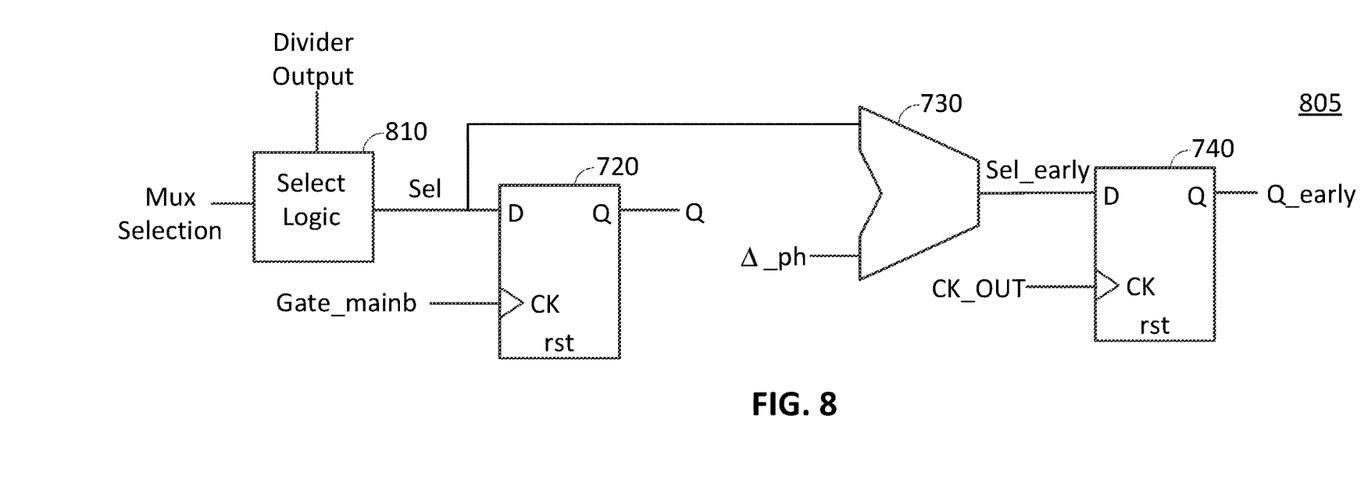
FIG. 8 shows another exemplary implementation of a select controller according to certain aspects of the present disclosure.

In certain aspects, it may be desirable to limit the number of phase jumps to one phase jump per clock cycle of the frequency divider output. This is because the frequency divider 250 may only be able to process one phase jump per divider clock cycle. In this regard, FIG. 8 shows an example in which the select controller 805 further includes select logic 810 configured to limit the number of phase jumps to one phase jump per clock cycle of the frequency divider output.

The select logic 810 receives a phase select signal Mux Selection for the phase selection multiplexer 310. The phase select signal Mux Selection may come from the phase selector 260 shown in FIG. 2. The select logic 810 also receives the output of the frequency divider 250, and outputs the phase select signal Sel to the first flip-flop 720 and the phase shifter 730, as shown in FIG. 7.

In operation, the select logic 810 monitors the phase select signal Mux Selection from the phase selector 260. The select logic 810 also monitors the output of the frequency divider 250 to detect clock cycles at the output of the frequency divider 250. For example, the select logic 810 may detect the start of a new clock cycle by detecting a rising edge at the output of the frequency divider 250. In this example, each clock cycle of the frequency divider output starts at a rising edge at the output of the frequency divider 250.

When phase select signal Mux Selection changes from a current phase to a new phase (jumps phases), the select logic 810 may determine whether phase select signal Sel has already changed phases during the current clock cycle (e.g., due to a previous phase change in Mux Selection). If not, then the select logic 810 may change phase select signal Sel from the current phase to the new phase. If phase select signal Sel has already changed phases during the current clock cycle, then the select logic 810 may wait until the next clock cycle to change phase select signal Sel from the current phase to the new phase. This helps ensure that the number of phase jumps per clock cycle of the frequency divider output does not exceed one. The processing of the select logic 810 may result in a short delay between a change in Mux Selection and the corresponding change in phase select signal Sel. If the phase selector 260 is configured to output only one phase change per clock cycle of the output of the frequency divider 250, then the select logic 810 may be omitted.

Figure 9:
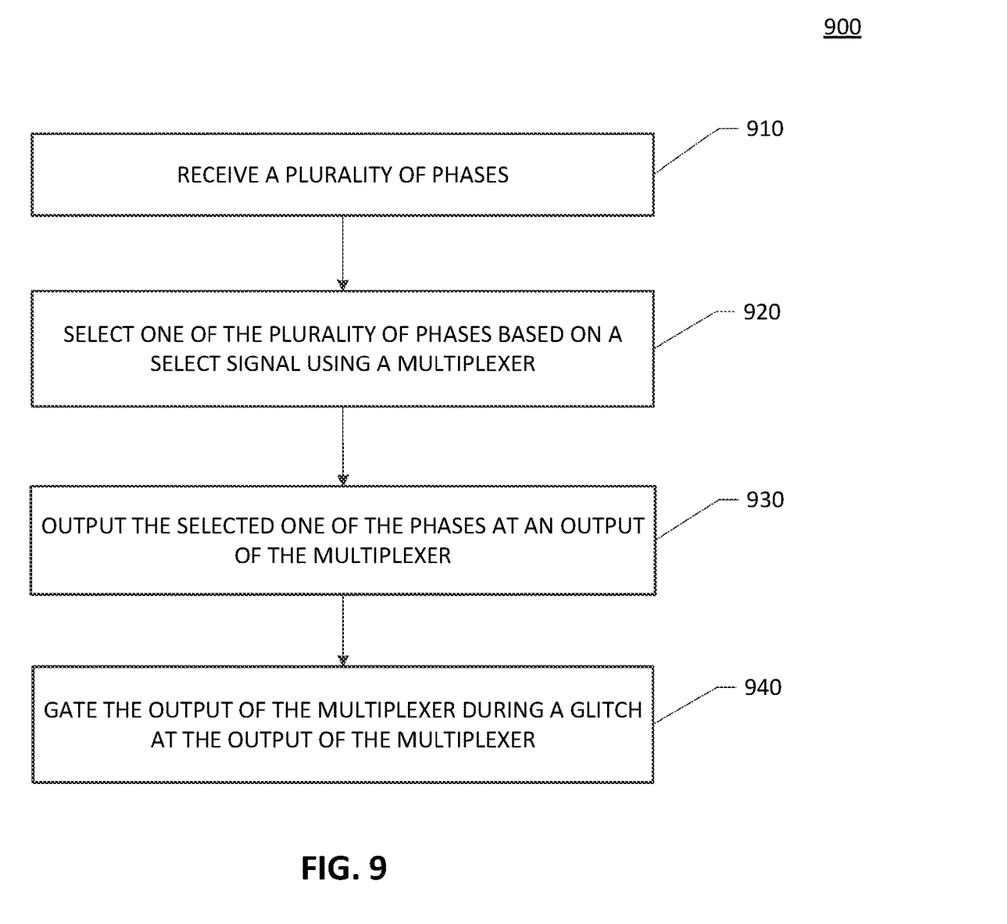
FIG. 9 is a flowchart illustrating a method for phase multiplexing according to certain aspects of the present disclosure.

FIG. 9 is a flowchart illustrating a method 900 for phase multiplexing according to certain aspects of the present disclosure. The method 900 may be performed by the phase selection multiplexer 310.

At step 910, a plurality of phases is received. For example, the plurality of phases may include different output phases of a voltage-controlled oscillator (e.g., VCO 240). The phases may be evenly spaced apart in phase (e.g., adjacent phases may be separated by T/16 if 16 phases are available, where T is one clock cycle of the VCO).

At step 920, one of the plurality of phases is selected based on a select signal using a multiplexer. For example, the first select signal may correspond to first select signal Q, and the first multiplexer may correspond to first MUX 315.

At step 930, the selected one of the plurality of phases is output at an output of the multiplexer. For example, the selected first one of the plurality of phases may correspond to output signal MUX_out.

At step 940, the output of the multiplexer is gated during a glitch at the output of the multiplexer. For example, the gating may start on a falling edge at the output of the multiplexer (e.g., first MUX 315). The gating may cease after the glitch and before the arrival of a next rising edge at the output of the multiplexer following the glitch. In this example, the glitch may be caused by a phase jump from a current phase to a new phase at the output of the multiplexer, and the next rising edge may correspond to a first full pulse of the new phase.

Examples of means for receiving a plurality of phases include the phase selection multiplexer 310, and the first multiplexer 315. Examples of means for selecting one of the plurality of phases based on a select signal include the first multiplexer 315, the select controller 705, the first flip-flop 720, and the phase selector 260. Examples of means for outputting the selected one of the plurality of phases at an output include the first multiplexer 315. Examples of means for gating the output during a glitch at the output include the first flip-flop 320, the gate circuit 380, and the gate flip-flop 510. Examples of means for starting the gating on a falling edge at the output and means for ceasing the gating after the glitch include the first flip-flop 320, the second flip-flop 360, the gate circuit 380, and the gate flip-flop 510. Examples of means for selecting a second one of the plurality of phases based on a second select signal include the second multiplexer 355, the select controller 705, the phase shifter 730, and the second flip-flop 740. Examples of means for outputting the selected second one of the plurality of phases at a second output include the second multiplexer 355. Examples of means for starting the gating on a falling edge at the first output and means for ceasing the gating on a rising edge at the second output include the first flip-flop 320, the second flip-flop 360, the gate circuit 380, and the gate flip-flop 510. Examples of means for generating the first select signal based on a phase select signal include the select controller 705, and the first flip-flop 720. Examples of means for phase shifting the phase select signal to generate the second select signal include the select controller 705, the phase shifter 730, and the second flip-flop 740.

The phase selection multiplexer 310 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A phase selection multiplexer, comprising:
   a multiplexer configured to receive a plurality of phases, to select one of the plurality of phases based on a select signal, and to output the selected one of the plurality of phases at an output of the multiplexer;
   a flip-flop having a clock input, a data input, and an output, wherein the clock input of the flip-flop is coupled to the output of the multiplexer; and
   a gate circuit coupled to the data input of the flip-flop, and also configured to receive the output of the flip-flop and an early output signal generated using another multiplexer, wherein the gate circuit is configured to generate a gate signal based on the output of the flip-flop and the early output signal, and to output the gate signal to the data input of the flip-flop, wherein the gate signal causes the flip-flop to gate the output of the multiplexer during a glitch at the output of the multiplexer.

2. The phase selection multiplexer of claim 1, wherein the gate circuit is configured to transition the gate signal from logic one to logic zero on a falling edge at the output of the flip-flop, and to transition the gate signal from logic zero to logic one after the glitch.

3. The phase selection multiplexer of claim 2, wherein the gate circuit is configured to transition the gate signal from logic zero to logic one before a next rising edge at the output of the multiplexer following the glitch.

4. The phase selection multiplexer of claim 1, further comprising a reset circuit configured to reset the flip-flop on a falling edge at the output of the multiplexer.

5. The phase selection multiplexer of claim 4, wherein the reset circuit comprises:
   an AND gate having a first input, a second input coupled to the output of the flip-flop, and an output coupled to a reset input of the flip-flop; and
   an inverter coupled between the output of the multiplexer and the first input of the AND gate.

6. The phase selection multiplexer of claim 1, wherein the plurality of phases are different phases of a voltage-controlled oscillator, and the output of the flip-flop is coupled to a frequency divider.

7. The phase selection multiplexer of claim 1, wherein the gate signal is logically low during the glitch at the output of the multiplexer.

8. A phase selection multiplexer comprising:
   a first multiplexer configured to receive a plurality of phases, to select a first one of the plurality of phases based on a first select signal, and to output the selected first one of the plurality of phases at an output of the first multiplexer;
   a first flip-flop having a clock input, a data input coupled to a first gate signal, and a first output, wherein the clock input of the first flip-flop is coupled to the output of the first multiplexer;
   a second multiplexer configured to receive the plurality of phases, to select a second one of the plurality of phases based on a second select signal, and to output the selected second one of the plurality of phases at an output of the second multiplexer;
   a second flip-flop having a clock input coupled to the output of the second multiplexer, a data input coupled to a second gate signal, and an output; and
   a gate circuit coupled to the output of the first flip-flop and the output of the second flip-flop, wherein the gate circuit is configured to generate the first gate signal, and to output the first gate signal to the data input of the first flip-flop, wherein the gate circuit is configured to generate the first gate signal based on the output of the first flip-flop and the output of the second flip-flop.

9. The phase selection multiplexer of claim 8, wherein the gate circuit is configured to transition the first gate signal from logic one to logic zero on a falling edge at the output of the first flip-flop, and to transition the first gate signal from logic zero to logic one on a rising edge at the output of the second flip-flop.

10. The phase selection multiplexer of claim 8, wherein the second gate signal is a logical inverse of the first gate signal.

11. The phase selection multiplexer of claim 8, wherein the selected second one of the plurality of phases is early relative to the selected first one of the plurality of phases.

12. The phase selection multiplexer of claim 8, further comprising a select controller configured to generate the first select signal based on a phase select signal, and to phase shift the phase select signal to generate the second select signal.

13. The phase selection multiplexer of claim 12, wherein, when the phase select signal changes, the selection controller is configured to change the first select signal on a falling edge at the output of the first flip-flop.

14. The phase selection multiplexer of claim 12, wherein the select controller comprises:
   a third flip-flop having a clock input coupled to the second gate signal, a data input coupled to the phase select signal, and an output, wherein the first select signal is output by the output of the third flip-flop;
   a phase shifter configured to phase shift the phase select signal to generate a phase-shifted phase select signal; and
   a fourth flip-flop having a clock input coupled to the output of the first flip-flop, a data input coupled to the phase-shifted phase select signal, and an output, wherein the second select signal is output by the output of the fourth flip-flop.

15. A method for phase multiplexing, comprising:
   receiving a plurality of phases;
   selecting one of the plurality of phases based on a select signal using a multiplexer;

outputting the selected one of the plurality of phases at an output of the multiplexer to a flip-flop; and gating the output of the multiplexer using the flip-flop and a gating circuit configured to receive the output of the flip-flop and an early output signal generated using another multiplexer and generate a gating signal based on the output of the flip-flop and the early output signal, the gating signal causing the flip-flop to gate the output of the multiplexer during a glitch at the output of the multiplexer.

16. The method of claim 15, wherein gating the output of the multiplexer comprises:
    starting the gating on a falling edge at the output of the multiplexer; and
    ceasing the gating after the glitch.

17. The method of claim 15, wherein the output of the multiplexer is coupled to a clock input of the flip-flop, and gating the output of the multiplexer during the glitch comprises:
    generating a gate signal with the gating circuit; and
    inputting the gate signal to a data input of the flip-flop, wherein the gate signal causes the flip-flop to gate the output of the multiplexer during the glitch.

18. The method of claim 16, further comprising changing the select signal on the falling edge at the output of the multiplexer, wherein the change in the select signal causes the glitch at the output of the multiplexer.

19. The method of claim 16, wherein the gating ceases before a next rising edge at the output of the multiplexer following the glitch.

20. A method for phase multiplexing comprising:
    receiving a plurality of phases;
    selecting one of the plurality of phases based on a first select signal using a first multiplexer;
    outputting the selected one of the plurality of phases at an output of the first multiplexer to a first flip-flop;
    selecting a second one of the plurality of phases based on a second select signal using a second multiplexer;
    outputting the selected second one of the plurality of phases at an output of the second multiplexer to a second flip-flop; and
    gating the output of the first multiplexer using the first flip-flop and a gating circuit causing the first flip-flop to gate the output of the first multiplexer during a glitch at the output of the first multiplexer using a gating signal based on an output of the first flip-flop and an output of the second flip-flop.

21. The method of claim 20, wherein the selected second one of the plurality of phases is early relative to the selected first one of the plurality of phases.

22. The method of claim 20, further comprising:
    generating the first select signal based on a phase select signal; and
    phase shifting the phase select signal to generate the second select signal.

23. An apparatus for phase multiplexing, comprising:
    means for receiving a plurality of phases;
    means for selecting one of the plurality of phases based on a select signal;
    means for outputting the selected one of the plurality of phases at an output; and
    means for gating the output during a glitch at the output, the means for gating including a flip-flop and a gating circuit causing the flip-flop to gate the output, wherein the gating circuit is configured to receive the output of the flip-flop and an early output signal generated using another multiplexer and to generate a gating signal based on the output of the flip-flop and the early output signal.

24. The apparatus of claim 23, wherein the means for gating the output comprises:
    means for starting the gating on a falling edge at the output; and
    means for ceasing the gating after the glitch.

25. The apparatus of claim 24, wherein the gating ceases before a next rising edge at the output following the glitch.

26. The method of claim 20, wherein gating the output of the first multiplexer with the first flip-flop comprises:
    starting the gating on a falling edge at the output of the first multiplexer; and
    ceasing the gating on a rising edge at the output of the second multiplexer.

27. An apparatus for phase multiplexing comprising:
    means for receiving a plurality of phases;
    means for selecting a first one of the plurality of phases based on a first select signal;
    means for outputting the selected first one of the plurality of phases at a first output, the means for outputting the first one of the plurality of phases including a first flip-flop;
    means for selecting a second one of the plurality of phases based on a second select signal;
    means for outputting the selected second one of the plurality of phases at a second output, the means for outputting the second one of the plurality of phases including a second flip-flop; and
    means for gating the first output during a glitch, the means for gating including a gating circuit receiving the first output and the second output and causing the first flip-flop to gate the means for selecting the first one of the plurality of phases based on the first output and the second output.

28. The apparatus of claim 27, wherein the selected second one of the plurality of phases is early relative to the selected first one of the plurality of phases.

29. The apparatus of claim 28, further comprising:
    means for generating the first select signal based on a phase select signal; and
    means for phase shifting the phase select signal to generate the second select signal.

30. The apparatus of claim 27, wherein the means for gating the first output comprises:
    means for starting the gating on a falling edge at the first output; and
    means for ceasing the gating on a rising edge at the second output.

* * * * *